US012592680B2

(12) United States Patent
　　Tsai et al.

(10) Patent No.: US 12,592,680 B2
(45) Date of Patent: Mar. 31, 2026

(54) COUPLER DEVICE IN PHASED ARRAY SYSTEM

(71) Applicant: PHASETRUM INC., Taipei (TW)

(72) Inventors: Zuo-Min Tsai, Hsinchu City (TW);
Yi-Ting Lin, Taichung City (TW);
Chia-Hsuan Cheng, Hsinchu City
(TW)

(73) Assignee: PHASETRUM INC., Taipei (TW)

( * ) Notice: Subject to any disclaimer, the term of this
patent is extended or adjusted under 35
U.S.C. 154(b) by 70 days.

(21) Appl. No.: 18/487,144

(22) Filed: Oct. 16, 2023

(65) Prior Publication Data

US 2025/0125789 A1　　Apr. 17, 2025

(51) Int. Cl.
　　*H03H 11/16*　　(2006.01)
　　*H01P 5/16*　　(2006.01)
　　*H01Q 3/26*　　(2006.01)
　　*H03H 11/28*　　(2006.01)

(52) U.S. Cl.
　　CPC ............... *H03H 11/16* (2013.01); *H01P 5/16*
　　　　(2013.01); *H01Q 3/2652* (2013.01); *H03H*
　　　　　　　　　　　　　　　　*11/28* (2013.01)

(58) Field of Classification Search
　　CPC ....................................................... H03H 11/16
　　USPC .......................................................... 327/258
　　See application file for complete search history.

(56) References Cited

U.S. PATENT DOCUMENTS

2010/0156528 A1\*　6/2010　Couchman ............ H03F 1/3247
　　　　　　　　　　　　　　　　　　　330/124 R
2010/0259446 A1\*　10/2010　Corman .................. H03H 11/36
　　　　　　　　　　　　　　　　　　　342/368
2017/0244366 A1　8/2017　Hellberg et al.

FOREIGN PATENT DOCUMENTS

TW　　　201249121 A1　12/2012

OTHER PUBLICATIONS

Chia-Hsuan Cheng et al., "Researches on Full-Ka band Active 2D
Phased Array Beamforming System and Ka-band Wideband High
Output Power Amplifier", Master Thesis, Institute of Communica-
tions Engineering, National Yang Ming Chiao Tung University,
Nov. 2022.
Zong-Bin Huang et al., "A New Wideband mmWave Miniaturized
Simultaneous Multi Beam Analog Beamforming System", Master
Thesis, Department of Communications Engineering, National Yang
Ming Chiao Tung University, Jun. 2021.
Yi-Ting Lin, Zuo-Min Tsai, and Jen-Ming Wu, "High-Accuracy,
High-Gain Phased Array Utilizing Matrix-Sum and Tunable Ampli-
fier Techniques", IEEE Access, Sep. 22, 2023.
1st Office Action of the corresponding Taiwan patent application
No. 112139318 mailed on Aug. 23, 2024.

\* cited by examiner

*Primary Examiner* — Tomi Skibinski
(74) *Attorney, Agent, or Firm* — Idea Intellectual Limited;
Sam T. Yip

(57) ABSTRACT

The present disclosure provides a coupler device for use in
a phased array system. The coupler device includes a
weighting network and a phase matrix network. The weight-
ing network is configured to convert and amplify an input
signal to obtain eight intermediate amplified signals. The
phase matrix network is coupled to the weighting network,
and is configured to generate eight output signals based on
the eight intermediate amplified signals. An output array of
the eight output signals are obtained by performing a matrix
multiplication of an array of the eight intermediate amplified
signals with a phase matrix of the phase matrix network.

19 Claims, 19 Drawing Sheets

COUPLER DEVICE IN PHASED ARRAY SYSTEM

FIELD OF THE INVENTION

The present disclosure relates to wireless communication systems, and, in particular, to a coupler device for use in a phased array system.

BACKGROUND

Phased-array technology has become popularly deployed in systems and sub-systems of various applications, including 5G and beyond, due to its ability to generate beams, which improves power link budgets and tracking accuracy. The precise control provided of amplitude and phase of the RF signal for each antenna is essential for synthesizing desired beam patterns. The resulting ability to accurately adjust phase shifting and amplitude weighting is indispensable in phased array systems. The tuning range of the phase shifting and amplitude weighting determines the properties of the beam patterns, such as angle range, width, and beam type (e.g., sum or difference beam pattern). The accuracy of the phase and amplitude adjustments determines the deviation and resolution of the beam angle.

SUMMARY OF THE DISCLOSURE

In an aspect of the present disclosure, a coupler device for use in a phased array system is provided. The coupler device includes a weighting network and a phase matrix network. The weighting network is configured to convert and amplify an input signal to obtain eight intermediate amplified signals. The phase matrix network is coupled to the weighting network, and is configured to generate eight output signals based on the eight intermediate amplified signals. An output array of the eight output signals are obtained by performing a matrix multiplication of an array of the eight intermediate amplified signals with a phase matrix of the phase matrix network.

In another aspect of the present disclosure, a coupler device for use in a phased array system is provided. The coupler device includes a weighting network and a phase matrix network. The weighting network includes a plurality of tunable amplifiers arranged in two stages. The plurality of tunable amplifiers are configured to convert an input signal to a first amplified signal, a second amplified signal, a third amplified signal, and a fourth amplified signal. The phase matrix network is coupled to the weighting network. The phase matrix network is configured to generate a first output signal, a second output signal, a third output signal, and a fourth output signal based on the first amplified signal, the second amplified signal, the third amplified signal, and the fourth amplified signal.

BRIEF DESCRIPTION OF THE DRAWINGS

Aspects of the present disclosure are best understood from the following detailed description when read with the accompanying figures. It is noted that in accordance with the standard practice in the industry, various features are not drawn to scale. In fact, the dimensions of the various features may be arbitrarily increased or reduced for clarity of discussion.

DETAILED DESCRIPTION

Figure 1:
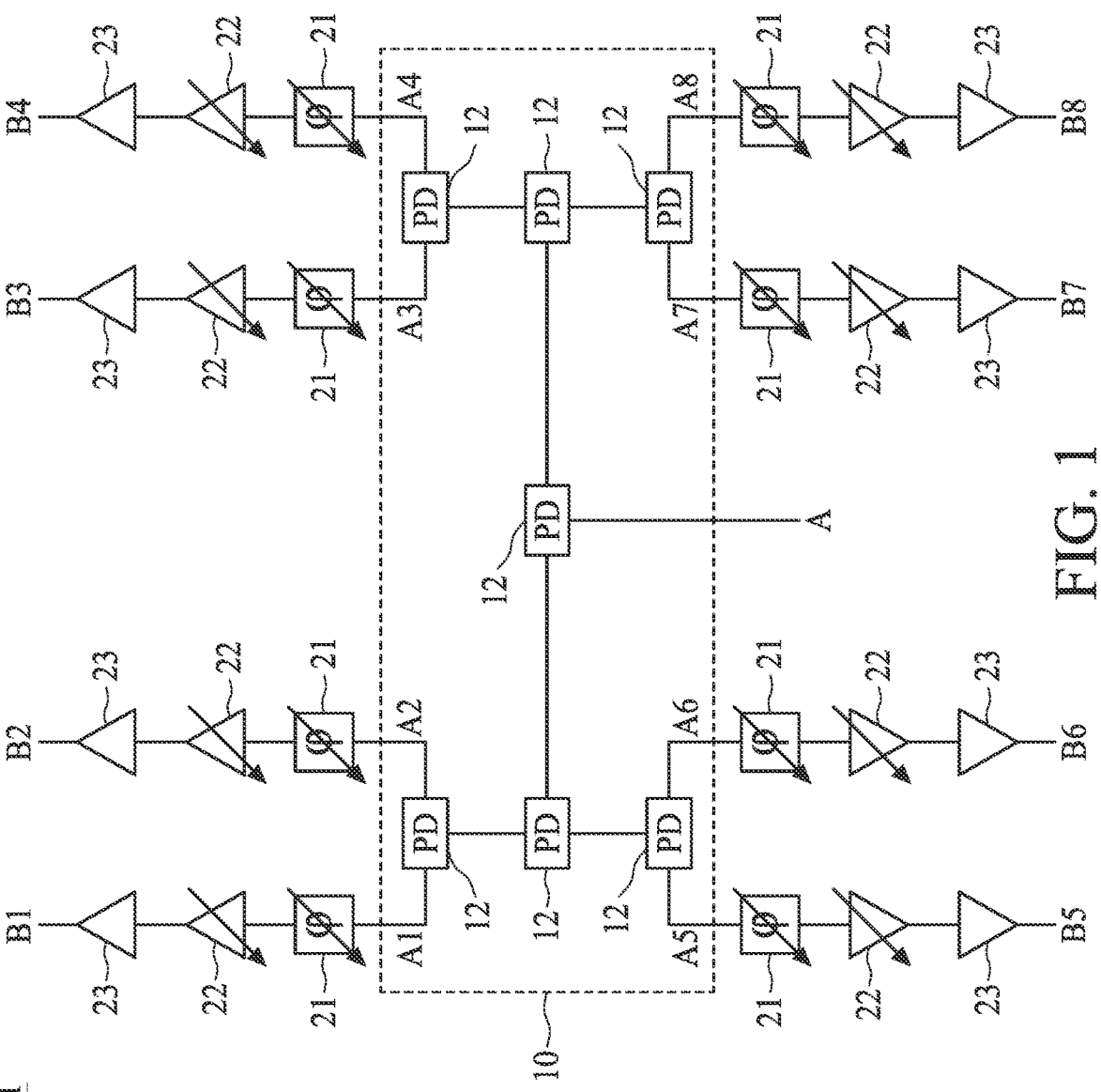
FIG. 1 is a block diagram of a phased array system 1 in accordance with an embodiment of the present disclosure.

The following disclosure provides many different embodiments, or examples, for implementing different features of the provided subject matter. Specific examples of operations, components, and arrangements are described below to simplify the present disclosure. These are, of course, merely examples and are not intended to be limiting. For example, a first operation performed before or after a second operation in the description may include embodiments in which the first and second operations are performed together, and may also include embodiments in which additional operations may be performed between the first and second operations. For example, the formation of a first feature over, on or in a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Time relative terms, such as "prior to," "before," "posterior to," "after" and the like, may be used herein for ease of description to describe one operations or feature's relationship to another operation(s) or feature(s) as illustrated in the figures. The time relative terms are intended to encompass different sequences of the operations depicted in the figures. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Relative terms for connections, such as "connect," "connected," "connection," "couple," "coupled," "in communication," and the like, may be used herein for ease of description to describe an operational connection, coupling, or linking one between two elements or features. The relative terms for connections are intended to encompass different connections, coupling, or linking of the devices or components. The devices or components may be directly or indirectly connected, coupled, or linked to one another through, for example, another set of components. The devices or components may be wired and/or wireless connected, coupled, or linked with each other.

As used herein, the singular terms "a," "an," and "the" may include plural referents unless the context clearly indicates otherwise. For example, reference to a device may include multiple devices unless the context clearly indicates otherwise. The terms "comprising" and "including" may indicate the existences of the described features, integers, steps, operations, elements, and/or components, but may not exclude the existences of combinations of one or more of the features, integers, steps, operations, elements, and/or components. The term "and/or" may include any or all combinations of one or more listed items.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The nature and use of the embodiments are discussed in detail as follows. It should be appreciated, however, that the present disclosure provides many applicable inventive concepts that can be embodied in a wide variety of specific contexts. The specific embodiments discussed are merely illustrative of specific ways to embody and use the disclosure, without limiting the scope thereof.

FIG. 1 is a block diagram of a phased array system 1 in accordance with an embodiment of the present disclosure. The phased array system 1 may include a power distribution network 10, a plurality of phase shifters 21 (i.e., represented by the symbols q), a plurality of variable gain amplifiers 22, and a plurality of amplifiers 23. For purposes of description, there are 8 output paths of the power distribution network 10, each of which corresponds to a respective phase shifter 21, a respective variable gain amplifier 22, and a respective amplifier 23. The phased array system 1 may receive an input signal A distributed to each of the phase shifters 11 over the power distribution network 10. For example, the power distribution network 10 may include a plurality of power dividers 12, each of which may be configured to distribute the input power equally at two output ports. Thus, input signal A can be equally distributed to 8 output signals A1 to A8 by the power dividers 12 in the power distribution network 10, and the output signals A1 to A8 are fed to the respective phase shifters 21.

In some embodiments, the phase shifters 21 may be digitally controlled phase shifters, each of which may be configured to convert a phase of an input signal (e.g., A1 to A8) to generate an output signal with a respective preset phase according to a respective control parameter (not shown in FIG. 1). The phase shifters 21 may electronically vary the phase in a progressive repetitive manner between 0 and 360° to create a specific scan pattern. The output signal of each phase shifter 21 may be amplitude-weighted by a respective variable gain amplifier (VGA) 22, and the amplitude-weighted signals are amplified by the respective amplifiers 23 to generate desired output signals (e.g., B1 to B8). The output signals B1 to B8 may be radiated by respective antennae (not shown in FIG. 1), thereby synthesizing different beam cases.

However, due to the architecture of the phased array system 1, there may be three stages of power dividers 12 in the power distribution network 10, with each possibly causing a 3 dB power loss while dividing the input signal to two output signals. If more antennae are used by the phase array system 1, there will be more stages of the power dividers 12 in the power distribution network 10, resulting in more power loss of the output signals of the power distribution network. For example, if 8 antenna units are used, there may be 3 dB*3=9 dB power loss of each output signal A1 to A8 of the power distribution network. If a target output power is 20 dB, the amplifiers 23 at the output stage may require a high gain of over 29 dB to compensate the signal loss of the power distribution network 10.

Figure 2A:
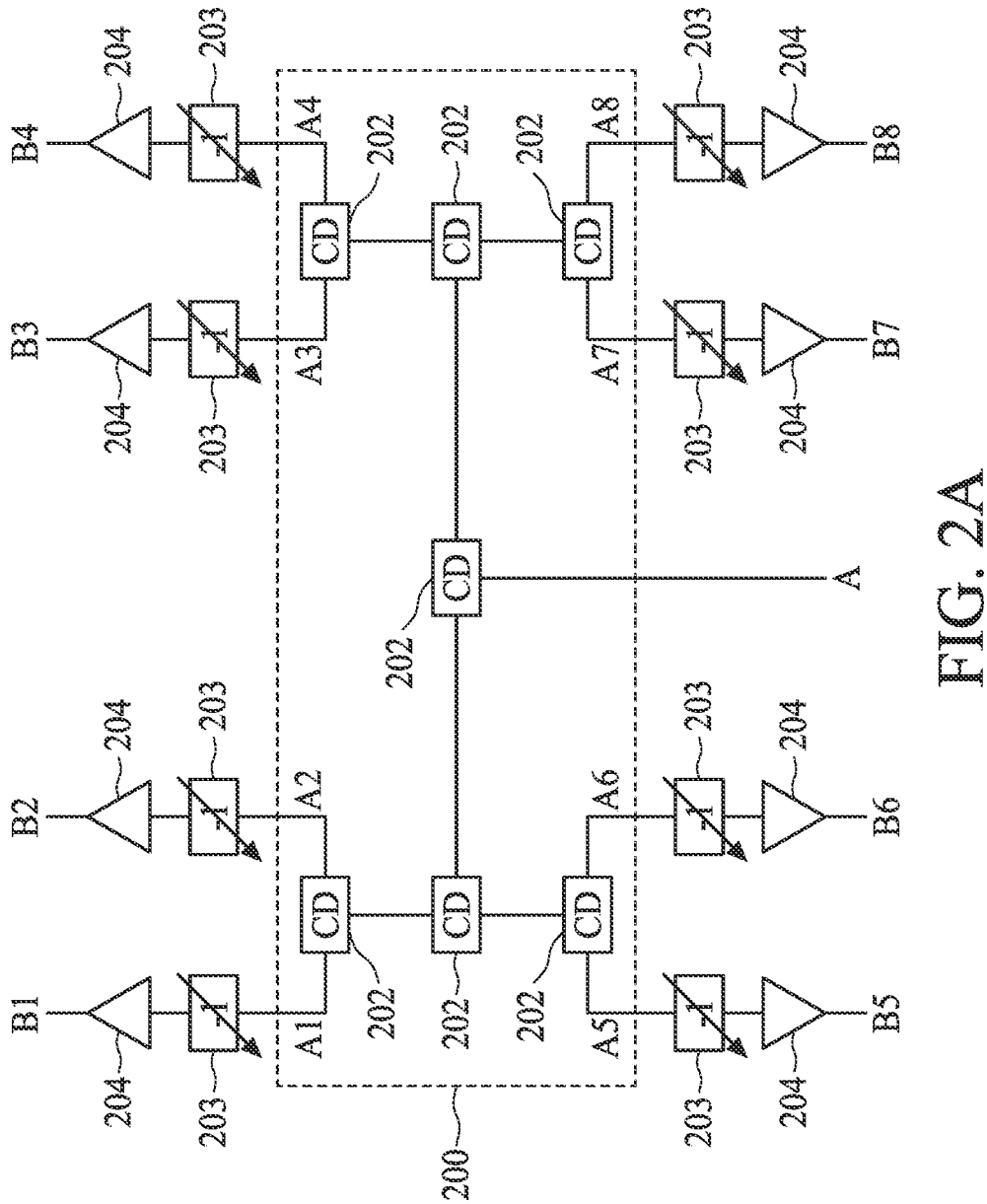
FIG. 2A is a block diagram of a phased array system 2 in accordance with an embodiment of the present disclosure.
Figure 2B:
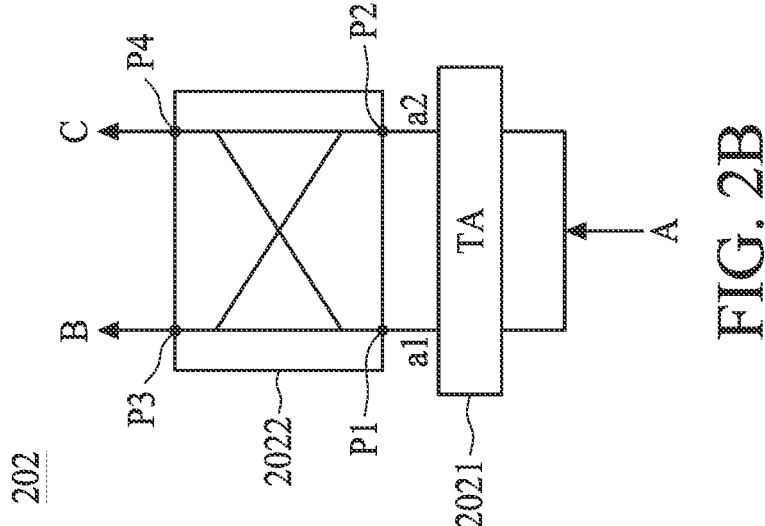
FIG. 2B is a block diagram of a coupler device of the embodiment of FIG. 2A.
Figure 2C:
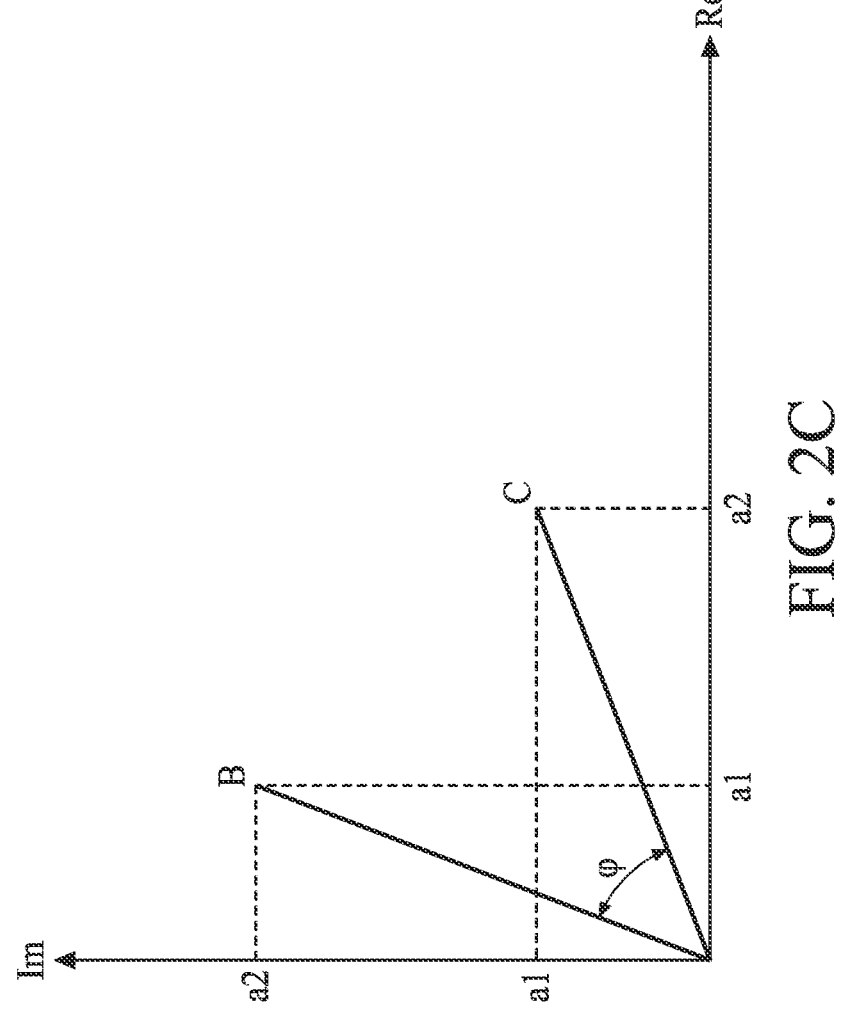
FIG. 2C is a diagram illustrating output signals B and C of FIG. 2B on a complex plane.

FIG. 2A is a block diagram of a phased array system 2 in accordance with an embodiment of the present disclosure. FIG. 2B is a block diagram of the coupler device 202 in accordance with the embodiment of FIG. 2A. FIG. 2C is a diagram illustrating the output signals B and C on a complex plane in accordance with the embodiment of FIG. 2B. Please refer to FIGS. 2A-2C.

In some embodiments, the phased array system 2 may include a weighting network 200. The weighting network 200 may include a plurality of coupler devices 202. For purposes of description, 8 output signals B1 to B8 are generated by the weighting network 200 of the phased array system 2, and the coupler devices 202 may be arranged in a 3-stage cascaded architecture, but the present disclosure is not limited thereto. The output signals B1 to B8 may be radiated by respective antennae (not shown in FIG. 2A), thereby synthesizing different beam cases.

For example, the coupler devices 202 may be configured to amplify the input signal A, re-arrange the power ratio, and adjust the magnitude and/or phase of the output signal at each path to the respective amplifiers 204 to generate desired output signals to synthesize different beam cases. The output signal (e.g., A1 to A8) at each path of the weighting network 200 may be sent to the respective amplifiers 204 at the output stage, and the amplified output signal at each path may be radiated by the respective antenna (not shown in FIG. 2A). In some other embodiments, the output signal (e.g., A1 to A8) at each path of the weighting network 200 may be sent to respective phase inverters (not shown in FIG. 2A). The phase-inverted output signal at each path may be sent to the respective amplifier 204 at the output stage, and the amplified output signal at each path may be radiated by the respective antenna (not shown in FIG. 2A).

Referring to FIG. 2B, the coupler device 202 may include a tunable amplifier 2021 and a coupler 2022. The tunable amplifier 2021 may be configured to control the gains of intermediate signals a1 and a2 based on the input signal A, respectively. The coupler 2022 may be configured to generate the output signals B and C based on the intermediate signals a1 and a2. More specifically, each of the coupler devices 202 shown in FIG. 2A may be configured to control a phase difference of the two output signals B and C thereof to fixed phase angle φ, which can be expressed by formula (1) as follows.

$$\text{phase}(B) - \text{phase}(C) = \varphi \qquad (1)$$

In addition, the relationship between the phases of the input signal A and output signals B and C can be expressed by formula (2) as follows.

$$\begin{cases} \text{phase}(B) - \text{phase}(A) = \dfrac{\varphi}{2} \\ \text{phase}(C) - \text{phase}(A) = -\dfrac{\varphi}{2} \end{cases} \qquad (2)$$

In some embodiments, the coupler 2022 may be a substantially 90° hybrid coupler, with two input ports P1 to P2 and two output ports P3 to P4. Two paths (i.e., two transmission lines) couple each input port to the two output ports P3 to P4. For example, a first transmission line may be coupled between the input port P1 and the output port P3, a second transmission line may be coupled between the input port P1 and the output port P4, and a third transmission line may be coupled between the input port P2 and the output port P3, and a fourth transmission line may be coupled between the input port P2 and the output P4.

The output signals B and C may be a linear combination of the intermediate signals a1 and a2. For example, a first portion of the output signal B may be from intermediate signal a1 which passes directly from the input port P1 to the output port P3 through a first transmission line, and a second portion of the output signal B may be from the intermediate signal a2 which passes from the input port P2 to the output port P3 through a second transmission line with a substantially 90° phase shift. Thus, the output signal B (i.e., vector B) can be expressed by formula (3) as follows.

$$B = a1 \angle 0° + j \cdot a2 \angle 90° = a1 + a2j \qquad (3)$$

Similarly, a first portion of the output signal C may be from the intermediate signal a2 which passes directly from the input port P2 to the output port P4, and a second portion of the output signal C may be from the intermediate signal a1 which passes from the input port P1 to the output port P4 with a substantially 90° phase shift. Thus, the output signal C (i.e., vector C) can be expressed by formula (4) as follows.

$$C = a2 \angle 0° + j \cdot a1 \angle 90° = a2 + a1j \qquad (4)$$

Accordingly, the output signals B and C can be illustrated on a complex plane as shown in FIG. 2C. It should be noted that there an inner angle φ separates the output signals B and C. The tunable amplifier 2021 can adjust a first gain and a second gain of the input signal A so as to control the magnitude of the signals a1 and a2, respectively, whereby inner angle φ shown in formula (1) can be controlled as well.

Figure 2D:
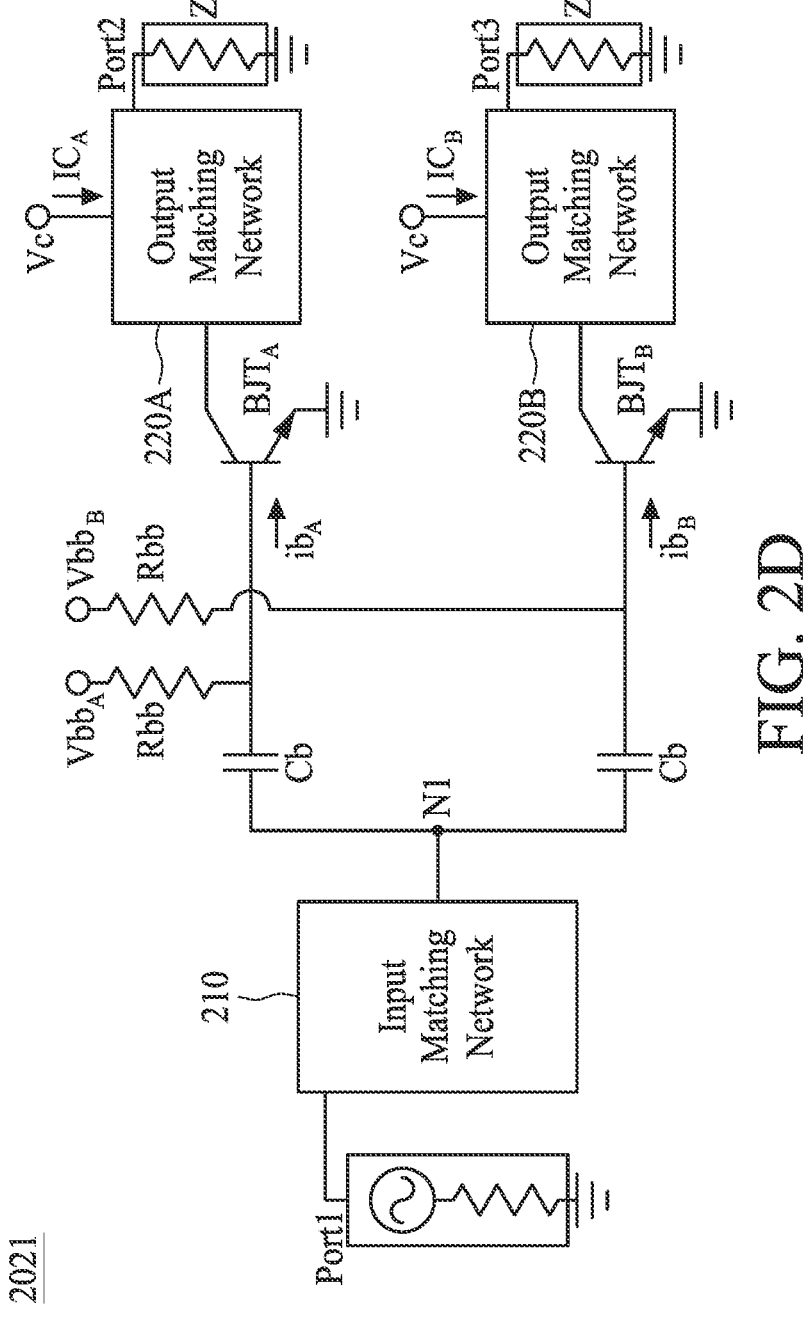
FIG. 2D is a schematic diagram of a tunable amplifier of FIG. 2B.
Figure 2E:
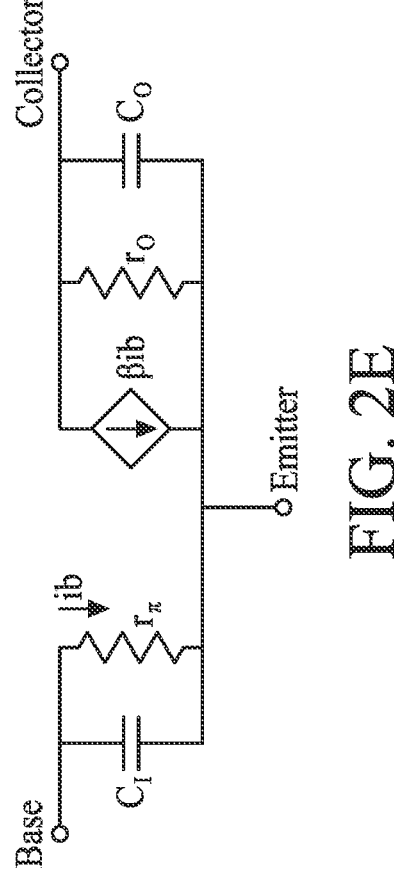
FIG. 2E is a diagram of a small-signal model of the BJT of FIG. 2D.
Figure 2F:
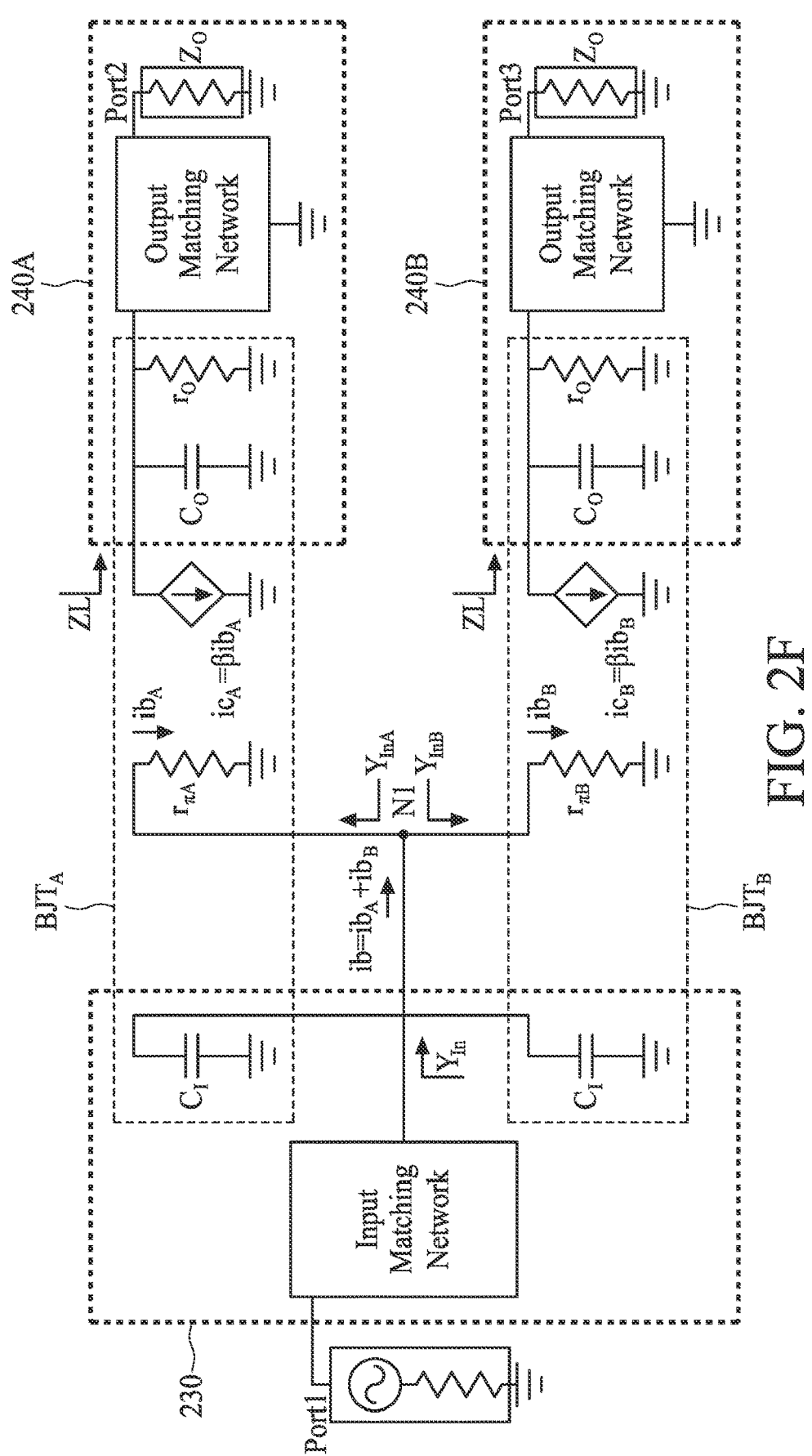
FIG. 2F is a diagram of a small-signal model of the tunable amplifier of FIG. 2D.
Figure 2G:
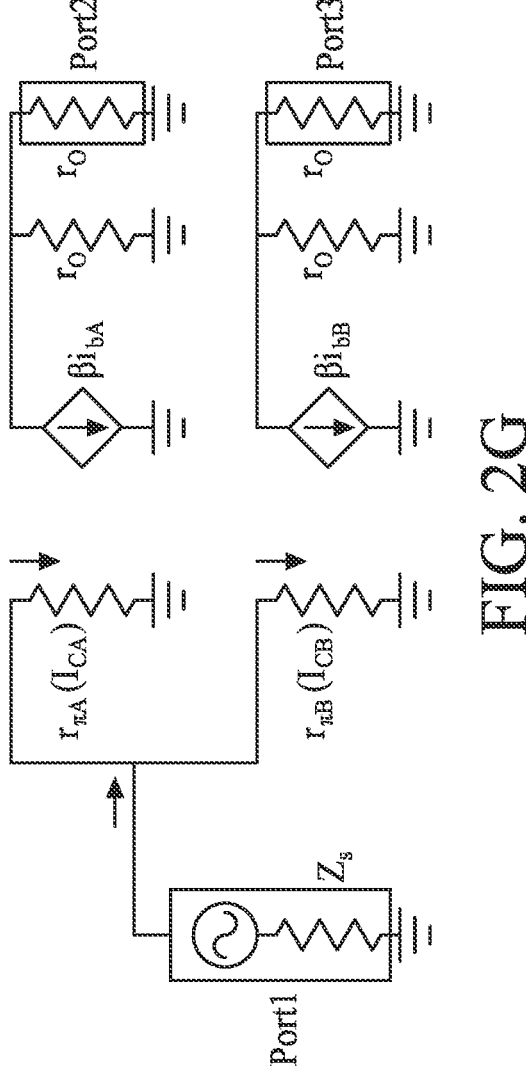
FIG. 2G is another diagram of a small-signal model of the tunable amplifier of FIG. 2D.

FIG. 2D is a schematic diagram of the tunable amplifier 2021 in accordance with the embodiment of FIG. 2B. FIG. 2E is a diagram of the small-signal model of a BJT in accordance with the embodiment of FIG. 2D. FIG. 2F is a diagram of the small-signal model of the tunable amplifier 2021 in accordance with the embodiment of FIG. 2D. FIG. 2G is another diagram of the small-signal model of the tunable amplifier 2021 in accordance with the embodiment of FIG. 2D. Please refer to FIGS. 2B and 2D to 2G.

The schematic diagram of the tunable amplifier 2021 is shown in FIG. 2D. In some embodiments, the bipolar junction transistors $BJT_A$ and $BJT_B$ may be provided with control voltages $Vbb_A$ and $Vbb_B$, respectively. In addition, the bipolar junction transistors $BJT_A$ and $BJT_B$ may be biased using large capacitors Cb and resistors Rbb, and. The values of the capacitors Cb and resistors Rbb may be large enough that the components shown in FIG. 2D may function as a biasing network, and can be omitted from the RF small-signal analysis. The bases of the bipolar junction transistors $BJT_A$ and $BJT_B$ may be connected to node N1, and the base currents $Ib_A$ and $Ib_B$ of the bipolar junction transistors $BJT_A$ and $BJT_B$ may be independently controlled by the control voltages $Vbb_A$ and $Vbb_B$.

An input matching network 210 may be applied to match the impedance of the shunted bipolar junction transistors $BJT_A$ and $BJT_B$ to the system impedance. The output matching networks 220A and 220B may be substantially the same, and may be applied to the output ports of the bipolar junction transistors $BJT_A$ and $BJT_B$ to match the output impedance of the bipolar junction transistors $BJT_A$ and $BJT_B$ to the system impedance $Z_0$. In addition, the output matching networks 220A and 220B may be configured to provide bias currents $Ic_A$ and $Ic_B$ of the bipolar junction transistors $BJT_A$ and $BJT_B$.

A small-signal model of a bipolar junction transistor (e.g., $BJT_A$ or $BJT_B$ in FIG. 2D) is shown in FIG. 2E, where CI and CO may denote equivalent capacitances at the base and collector nodes, respectively. The gain of the BJT with conjugate matched source/load impedance ($G_{BJT,M}$) can be evaluated using formula (5) as follows.

$$G_{BJT,M} = -\frac{\beta}{2} \sqrt{\frac{r_o}{r_\pi}} \qquad (5)$$

where $r_\pi$ denotes the input resistance of the BJT, $r_o$ denotes the output resistance of the BJT, and β denotes the current gain of the BJT. In addition, by applying the relationships between the parameters $r_\pi$, Ic and Ib (e.g., $$r_\pi = \frac{\beta V_T}{Ic}$$

and Ic=βIb), formula (5) can be rewritten as formula (6) as follows.

$$G_{BJT,M} = -\frac{1}{2}\sqrt{\frac{\beta r_o}{r_\pi}}\sqrt{Ic} \qquad (6)$$

Referring to the small-signal model of the tunable amplifier 2021 shown in FIG. 2F, the input resonated capacitance can be merged into the input matching network 210 and output matching networks 220A to 220B as source networks and load networks since the input nodes of the bipolar junction transistors $BJT_A$ and $BJT_B$ are shunted. Thus, the small-signal model of the tunable amplifier 2021 can be simplified to two current-controlled current sources connected to one source network 230 and two load networks 240A to 240B, and the simplified small-signal model of the tunable amplifier 2021 as shown in FIG. 2G.

In some embodiments, the link budget of the phased array system 2 shown in FIG. 2A may be associated with the total power of the signals. The input signal A may be distributed and weighted by the coupler devices 202 in the weighting network 200 to obtain the signals A1 to A8. The signals A1 to A8 may be amplified by respective amplifiers 204 at the output stage. Since the coupler 2022 of the coupler device 202 may be a lossless and passive component, the link budget of the phased array system 2 may be associated with the stages of coupler devices.

Referring to FIG. 2G, the input resistance $r_{\pi A}$ of the bipolar junction transistor $BJT_A$ can be expressed by the function of the collector current $I_{CA}$ (e.g., $$r_{\pi A} = \frac{\beta V_T}{I_{CA}}$$

and $I_{CA}=\beta I_{bA}$), and the input resistance of the bipolar junction transistor $BJT_B$ can be expressed by the function of the collector current $I_{CB}$ (e.g., $$r_{\pi B} = \frac{\beta V_T}{I_{CB}}$$

and $I_{CB}=\beta I_{bB}$). With such design of the tunable amplifier 2021, the gains of the output signals at the output ports Port2 and Port3 of the tunable amplifier 2021 can be independently controlled. Therefore, the tunable amplifier 2021 may be equivalent to an ideal power divider with amplifiers so as to achieve the functions of power conservation and signal amplification.

Figure 2H:
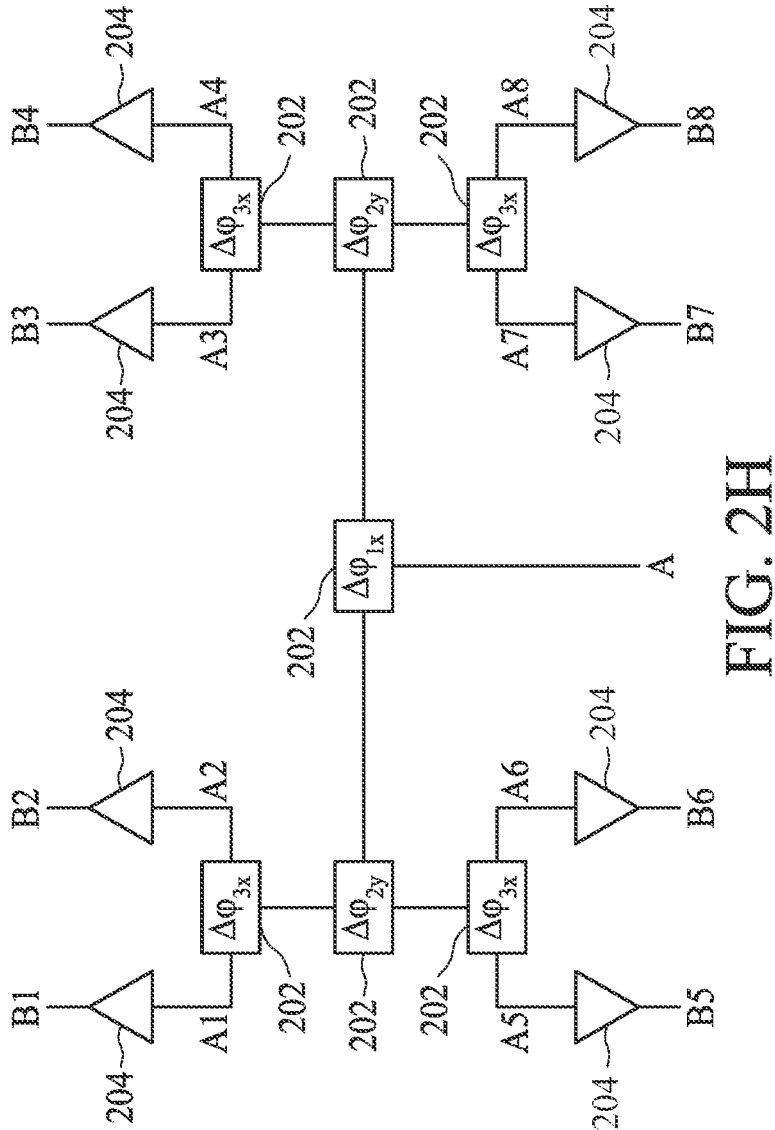
FIG. 2H illustrates phase control of the phased array system 2 in accordance with the embodiment of FIG. 2A.

FIG. 2H illustrates phase control of the phased array system 2 in accordance with the embodiment of FIG. 2A. As described in the embodiment of FIG. 2C, the phase difference between the output signals B and C of the coupler device 202 can be controlled by adjusting the gains of the output signals B and C using the tunable amplifier 2021, the coupler device 202 may also have the function of phase shifting. Thus, the coupler devices 202 can be appropriately arranged, so the phase difference of the output signals for each coupler device 202 can be horizontal and vertical. For example, regarding the coupler device 202 receiving the input signal A, a first-stage phase difference $\Delta\varphi_{1_x}$ may be horizontal (i.e., X-axis). For the coupler devices 202 in the second stage, a second-stage phase difference $\Delta\varphi_{2_y}$ may be vertical (i.e., Y-axis). For the coupler devices 202 in the third stage, a third-stage phase difference $\Delta\varphi_{3_x}$ may be horizontal (i.e., X-axis), as shown in FIG. 2H.

Figure 3:
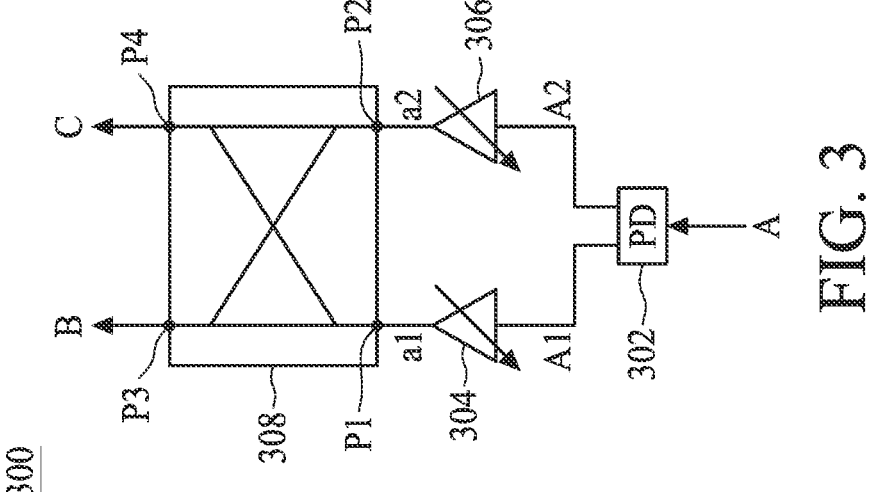
FIG. 3 is a block diagram of a coupler device 300 in accordance with another embodiment of the present disclosure.

FIG. 3 is a block diagram of a coupler device 300 in accordance with another embodiment of the present disclosure.

In some embodiments, the coupler device 202 shown in FIG. 2A may be implemented by the coupler device 300 shown in FIG. 3. The coupler device 300 may include a power divider 302, variable gain amplifiers 304 and 306, and a coupler 308.

The power divider 302 may be a 1-to-2 passive power divider configured to divide an input signal A into two signals A1 and A2. The signals A1 and A2 may be amplified by the variable gain amplifiers 304 and 306 to obtain intermediate signals a1 and a2, respectively. The gains of the variable gain amplifiers 304 and 306 may be controlled independently. The coupler 308 may be similar to the coupler 2022 shown in FIG. 2B, the details of which are not repeated here.

In the interest of power conservation, the power divider 302 may cause a 3 dB signal loss of the input signal A. As stages of the power dividers 302 increase, signal losses in the phased array system increase correspondingly. For example, three stages of coupler devices 202 are shown in FIG. 2A. Use of coupler devices 300 as coupler devices 202 crates a 9 dB signal loss. If a design of 64 antenna units is used, there will be 6 stages of coupler devices 300 which will cause a 3 dB*6=18 dB signal loss. Furthermore, the generated signal loss may be compensated by the amplifiers 204 at the output stage. If the output power requirement is 20 dB, the amplifiers 204 at the output stage require a very high gain of 38 dB, which may risk signal oscillation.

Figure 4:
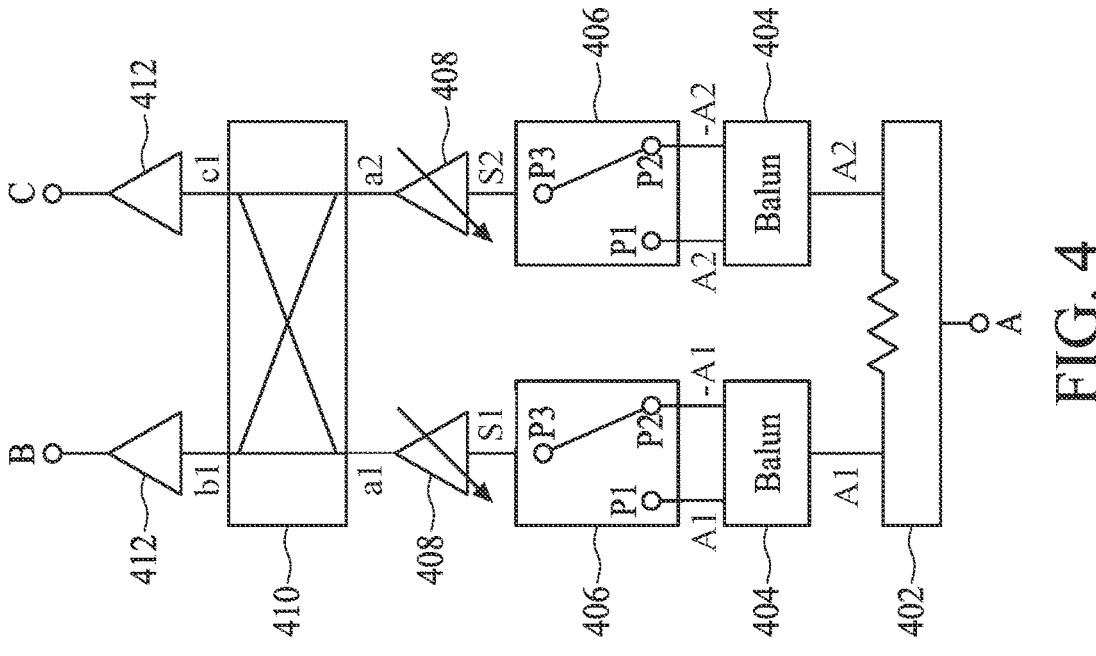
FIG. 4 is a block diagram of a coupler device in accordance with another embodiment of the present disclosure.

FIG. 4 is a block diagram of a coupler device in accordance with yet another embodiment of the present disclosure. Please refer to FIG. 2A and FIG. 4.

In another embodiment, the coupler device 202 shown in FIG. 2A can be implemented using the coupler device 400 shown in FIG. 4. The coupler device 400 may be a 1-to-2 coupler device, which includes a power divider 402, baluns (balance-to-unbalance) 404, switches 406, variable gain amplifier 408, a coupler 410, and amplifiers 412, as shown in FIG. 4.

Figure 5A:
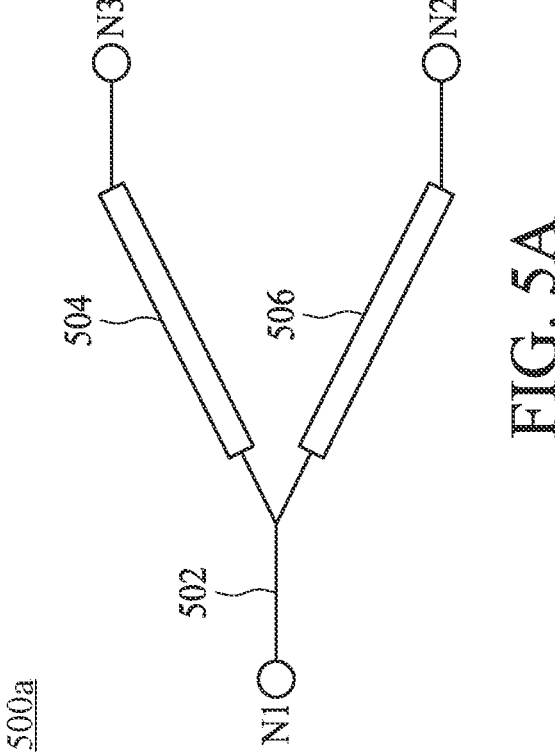
FIG. 5A is a diagram illustrating a power divider in accordance with an embodiment of the present disclosure.

In some embodiments, the power divider 402 may be a three-port microwave device that is used for power division or power combining. The power divider 402 may be a 1-to-2 passive power divider configured to divide an input signal A into two signals a1 and a2. In some embodiments, the power divider 402 may be implemented by a T-junction power divider 500a shown in FIG. 5A, which is a three-port network that can be implemented in any kind of transmission medium such as a microstrip line, stripline, coplanar waveguide, etc. In some embodiments, microstrip line 502 may have a characteristic impedance value approximately equal to 50 ohms, and the microstrip lines 504 and 506 may have characteristic impedance values approximately equal to 100 ohms, but the present disclosure is not limited thereto.

Figure 5B:
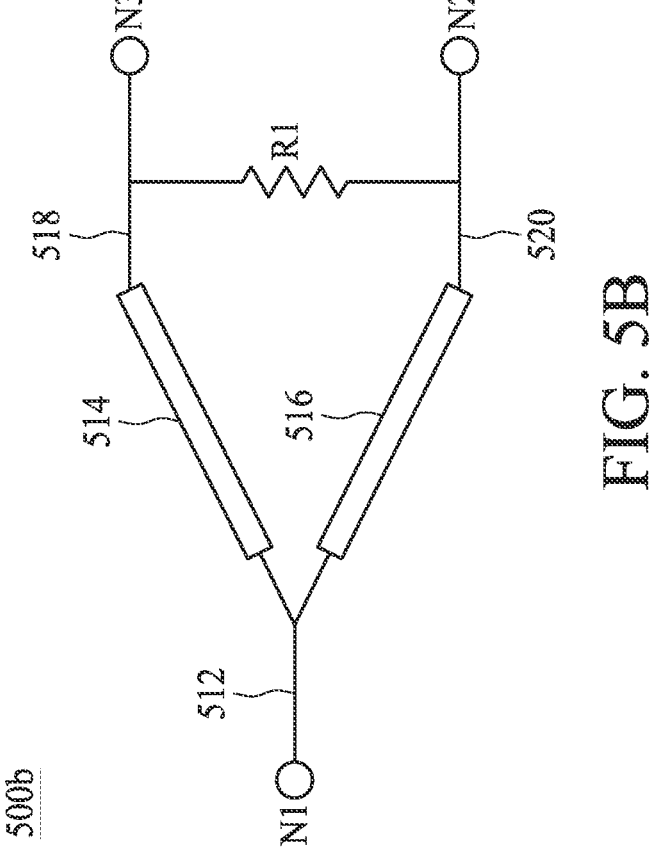
FIG. 5B is a diagram illustrating a power divider in accordance with another embodiment of the present disclosure.

In some embodiments, the power divider 402 may be implemented by a Wilkinson power divider 500b shown in FIG. 5B. The Wilkinson power divider 500b may be a robust power divider with the output ports matched, and with the reflected power dissipated, and it may provide better isolation between the output ports N2 and N3 in comparison with the T-junction power divider 500a shown in FIG. 5A. The Wilkinson power divider 500b can also be used to provide arbitrary power division. In some embodiments, the microstrip line 512 may have a characteristic impedance value approximately equal to 50 ohms, and the microstrip line 514 and 516 may have characteristic impedance values substantially equal to 70.7 ohms. The microstrip lines 518 and 520 may have characteristic impedance values substantially equal to 50 ohms, and the resistor R1 may have a resistance value substantially equal to 100 ohms, but the present disclosure is not limited thereto.

In some embodiments, each of the baluns 404 can be referred to as a balance-to-unbalance device that is configured to provide its input signal and phase-inverted input signal at its two output terminals. For example, the balun 404 on the left of FIG. 4 may receive the signal a1 as the input signal, and it may provide the signal a1 and the inverted signal −a1 at its two output terminals. Similarly, the balun 404 on the right of FIG. 4 may receive the signal a2 as its input signal, and it may provide the signal a2 and the inverted signal −a2 at its two output terminals. In some embodiments, the baluns 404 may be implemented using Marchand baluns 600 shown in FIG. 6, which is a wideband 3-port network including two sets of coupled lines. Each set of coupled lines may have a length substantially equal to λ/4, wherein λ denotes the wavelength of the radio frequency signal used by the phased array system 2 shown in FIG. 2A.

Figure 6:
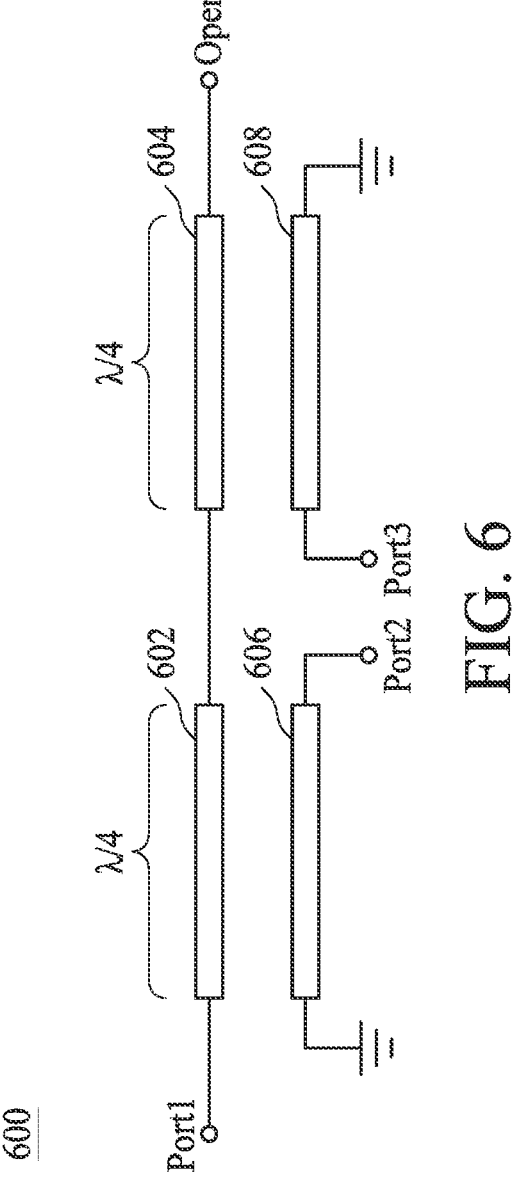
FIG. 6 is a diagram illustrating a Marchand balun in accordance with an embodiment of the present disclosure.

Referring to FIG. 6, Port1 refers to an unbalanced port, and Port2 and Port3 refer to balanced ports. In the configuration of the coupler device 400 in FIG. 4, the input signal A1 is fed to the unbalanced port Port1 of the balun 404 on the left, and signals A1 and −A1 may be generated at the balanced port Port2 and Port3. In addition, the input signal A2 is fed to the unbalanced port Port1 of the balun 404 on the right, and signals A2 and −A2 may be generated at the balanced port Port2 and Port3. In other words, the balanced port Port2 may provide an output signal that has a zero phase difference with the input signal, and the balanced port Port3 may provide an output signal has 180-degree phase difference (i.e., phase inverted input signal) with the input signal.

Attention now is directed back to FIG. 4. In some embodiments, the switches 406 may be implemented using series single-pole-double-throw (SPDT) switches or series-shunt SPDT switches, but the present disclosure is not limited thereto. In the configuration of the coupler device 400 in FIG. 4, the signal S1 may be the inverted signal A1 (i.e., −A1), and the signal S2 may be the inverted signal A2 (i.e., −A2). It should be noted that the signal selection of the switches 406 may be based on the design of the coupler device, and the signals S1 and S2 can be the signals A1 and A2 in some other embodiments.

In some embodiments, each of the variable gain amplifiers 408 may be a three-stage amplifier which includes a common-gate (CG) amplifier, a common-source (CS) amplifier, and a common-drain (CD) amplifier connected in series. The common-gate amplifier may be used as an input stage, the common-source amplifier may be used as a gain stage, and the common-drain amplifier may be used as an output stage. In some embodiments, a variable resistor (not shown) can be disposed between the common-gate amplifier and the common-source amplifier so as to adjust the gain of the common-source amplifier. In the configuration of the coupler device 400 shown in FIG. 4, the variable gain amplifiers 408 may be configured to amplify the signals S1 and S2 to generate signals a1 and a2.

In some embodiments, the coupler 410 may be implemented using a branch-line coupler or a coupled-line coupler, but the present disclosure is not limited thereto. For example, the coupler 410 may receive the signals a1 and a2 to generate signals b1 and c1. In some embodiments, the coupler 410 may be similar to the coupler 2022 shown in FIG. 2B, the details of which can be referred to in the embodiment of FIG. 2B. In addition, the In some embodiments, each of the amplifiers 412 may also be a three-stage amplifier which includes a common-gate (CG) amplifier, a common-source (CS) amplifier, and a common-drain (CD) amplifier connected in series. The common-gate amplifier may be used as an input stage, the common-source amplifier may be used as a gain stage, and the common-drain amplifier may be used as an output stage. In comparison with the variable gain amplifier 408, the gain of the amplifier 412 may be fixed so as to compensate the signal loss caused by the passive components in the coupler device 400, such as the power divider 402, baluns 404, and switches 406. In the configuration of the coupler device 400 shown in FIG. 4, the amplifiers 412 may be configured to amplify the signals a1 and a2 to generate output signals B and C. In some embodiments, the amplifiers 412 can be omitted in the coupler device 400, and other amplifiers (e.g., amplifiers 204) can be disposed at the output stage of each path of the phased array system 2 shown in FIG. 2A.

Figure 7A:
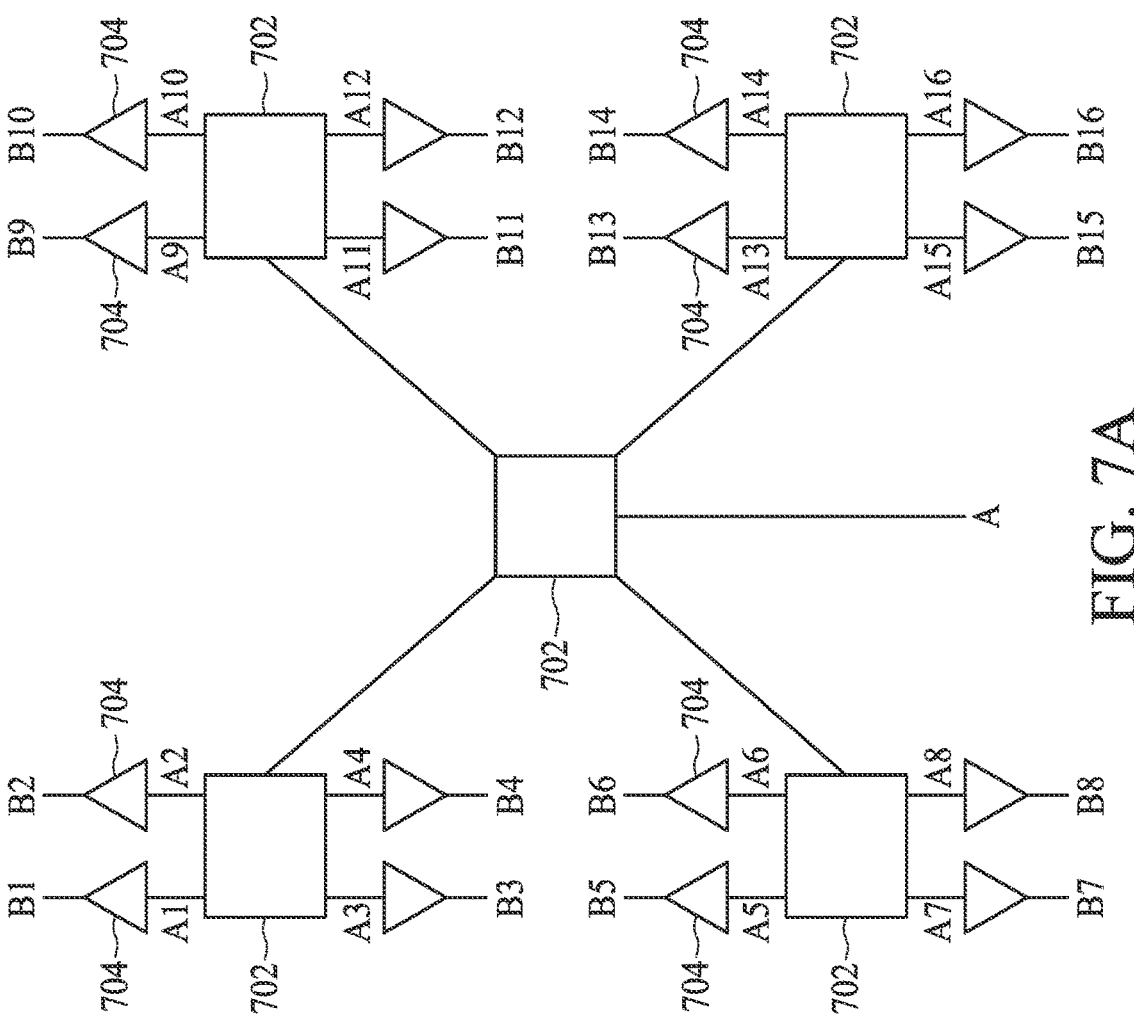
FIG. 7A is a block diagram of a phased array system in accordance with an embodiment of the present disclosure.
Figure 7B:
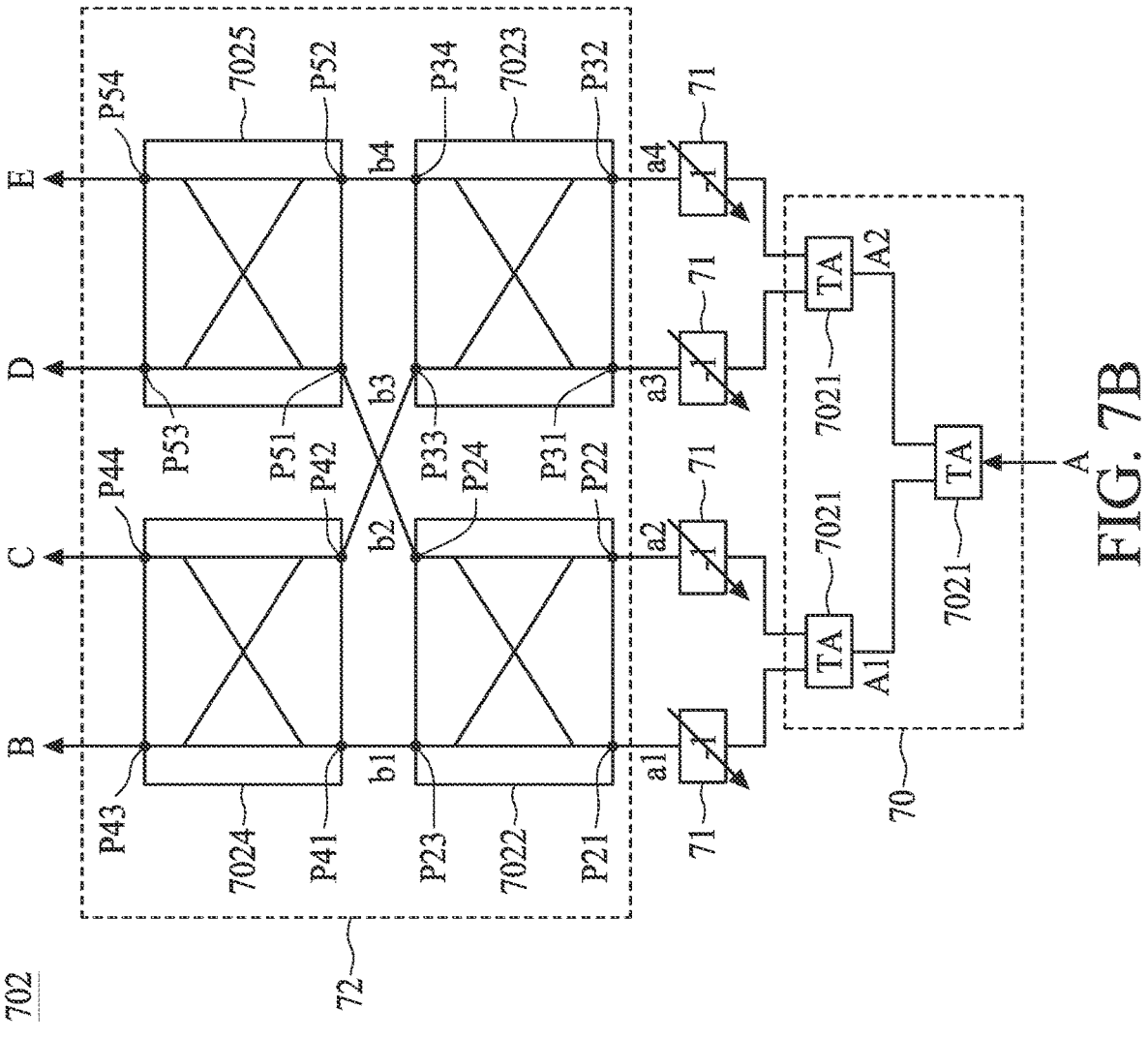
FIG. 7B is a block diagram of a coupler device in accordance with the embodiment of FIG. 7A.

FIG. 7A is a block diagram of a phased array system in accordance with an embodiment of the present disclosure. FIG. 7B is a schematic diagram of the coupler device 402 in accordance with the embodiment of FIG. 7A.

In some embodiments, the phased array system 7 shown in FIG. 7A may include a plurality of coupler devices 702. For purposes of description, 16 output signals B1 to B16 are generated by the phased array system 7, and the coupler devices 702 may be arranged in a 2-stage cascaded architecture, although the present disclosure is not limited thereto. The output signals B1 to B16 may be radiated by respective antennae (not shown in FIG. 7A), thereby synthesizing different beam cases.

In some embodiments, each of the coupler devices 702 may be a 1-to-4 coupler device configured to amplify the input signal A, re-arrange the power ratio, and adjust the magnitude and/or phase of the output signal at each path to the respective amplifiers 704 to generate desired output signals to synthesize different beam cases. The output signal (e.g., A1 to A16) at each path may be sent to the respective amplifier 704 at the output stage, and the amplified output signal (e.g., B1 to B16) at each path may be radiated by the respective antenna (not shown in FIG. 7A).

Coupler device 702, shown in FIG. 7B, may include a weighting network 70 and a phase matrix network 72. The weighting network 70 may include a plurality of tunable amplifiers 7021, and the phase matrix network 72 may include a plurality of couplers 7022 to 7025. The tunable amplifiers 7021 may be similar to the tunable amplifier 7021 shown in FIG. 2B, and may also have the functions of power conservation and signal amplification. The couplers 7022 to 7025 may be similar to the coupler 2022 shown in FIG. 2B, which may be substantially 90° lossless couplers.

Couplers 7022 to 7025 may be arranged in first and second stages. The first stage may include couplers 7022 and 7023, and the second stage may include couplers 7024 and 7025. The coupler 7022 may receive the intermediate signals a1 and a2 at its input ports P21 and P22, and generate intermediate signals b1 and b2 at its output ports P23 and P24. The coupler 4023 may receive the intermediate a3 and a4 at its input ports P31 and P32, and generate intermediate signals b3 and b4 at its output ports P33 and P34.

The coupler 7024 may receive the intermediate signals b1 and b3 at its input ports P41 and P42, and generate output signals B and C at its output ports P43 and P44. The coupler 7025 may receive the intermediate signals b2 and b4 at its input ports P51 and P52, and generate output signals D and E at its output ports P53 and P54.

Figure 8:
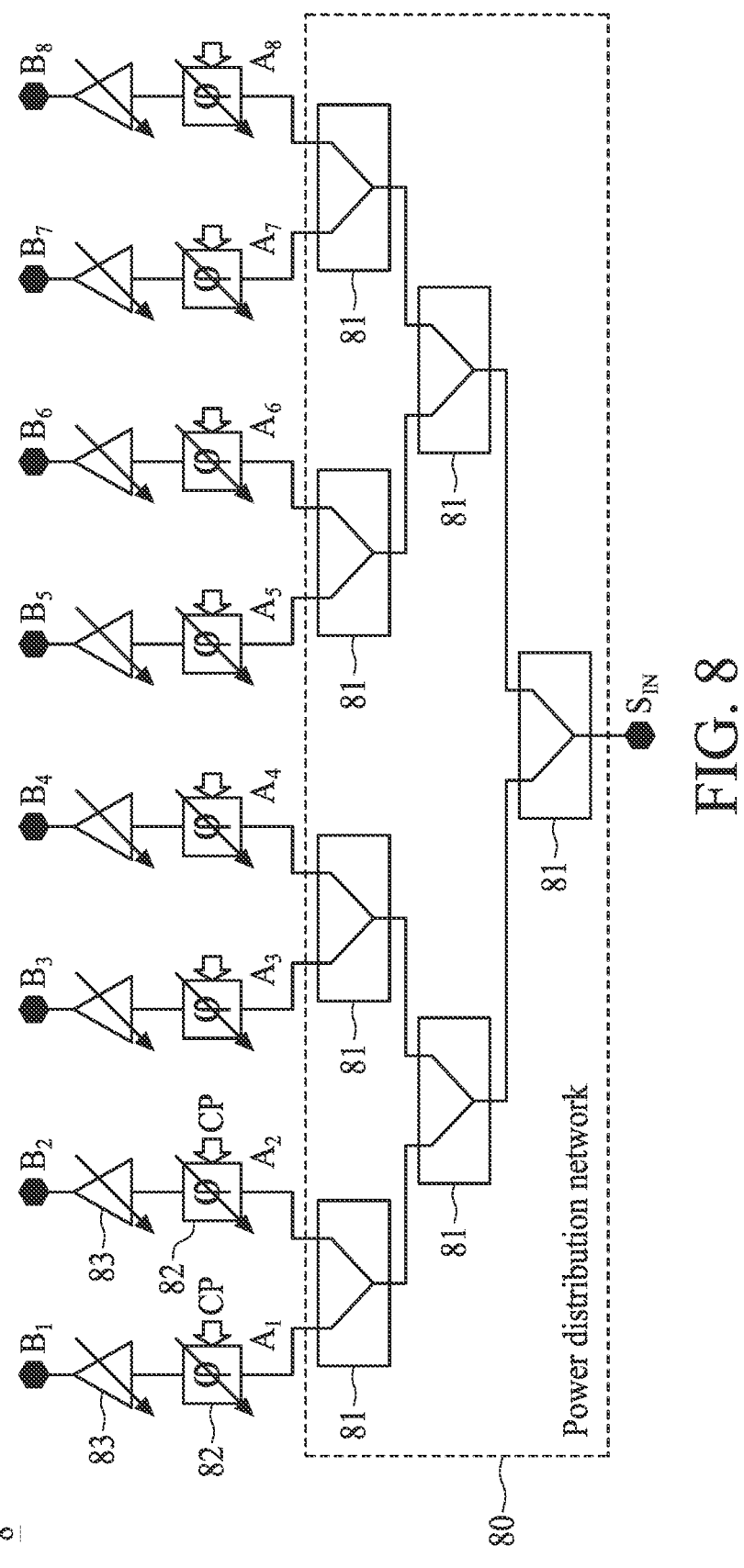
FIG. 8 is a block diagram of a phased array system in accordance with another embodiment of the present disclosure.

FIG. 8 is a block diagram of a phased array system in accordance with another embodiment of the present disclosure.

In some embodiments, the phased array system 8 shown in FIG. 8 may be similar to the phased array system 1 shown in FIG. 1. The phased array system 8 may include a power distribution network 80, a plurality of phase shifters 82, and a plurality of variable gain amplifiers 83. The power distribution network 80 may include a plurality of power dividers 81 that are arranged in a three-stage cascaded architecture. The power divider 81 may be configured to divide an input signal to two equal output signals. The output signal (e.g., $A_1$ to $A_8$) at each output path of the power distribution network 80 may be fed to a respective phase shifter 82. Each of the phase shifters 82 may be controlled by a respective control parameter CP so as to adjust the amount of phase shift of the input signal. Each of the variable gain amplifiers 83 may be configured to amplify the phase shifted signal from the respective phase shifter 82 so as to generate an output signal (e.g., $B_1$ to $B_8$).

However, each stage of power dividers 81 in the power distribution network 80 may possibly cause a 3 dB power loss while dividing the input signal to two output signals. If 8 antenna units are used, three stages of power dividers 81 may cause a 3 dB*3=9 dB power loss of the input signal $S_{IN}$.

Figure 9:
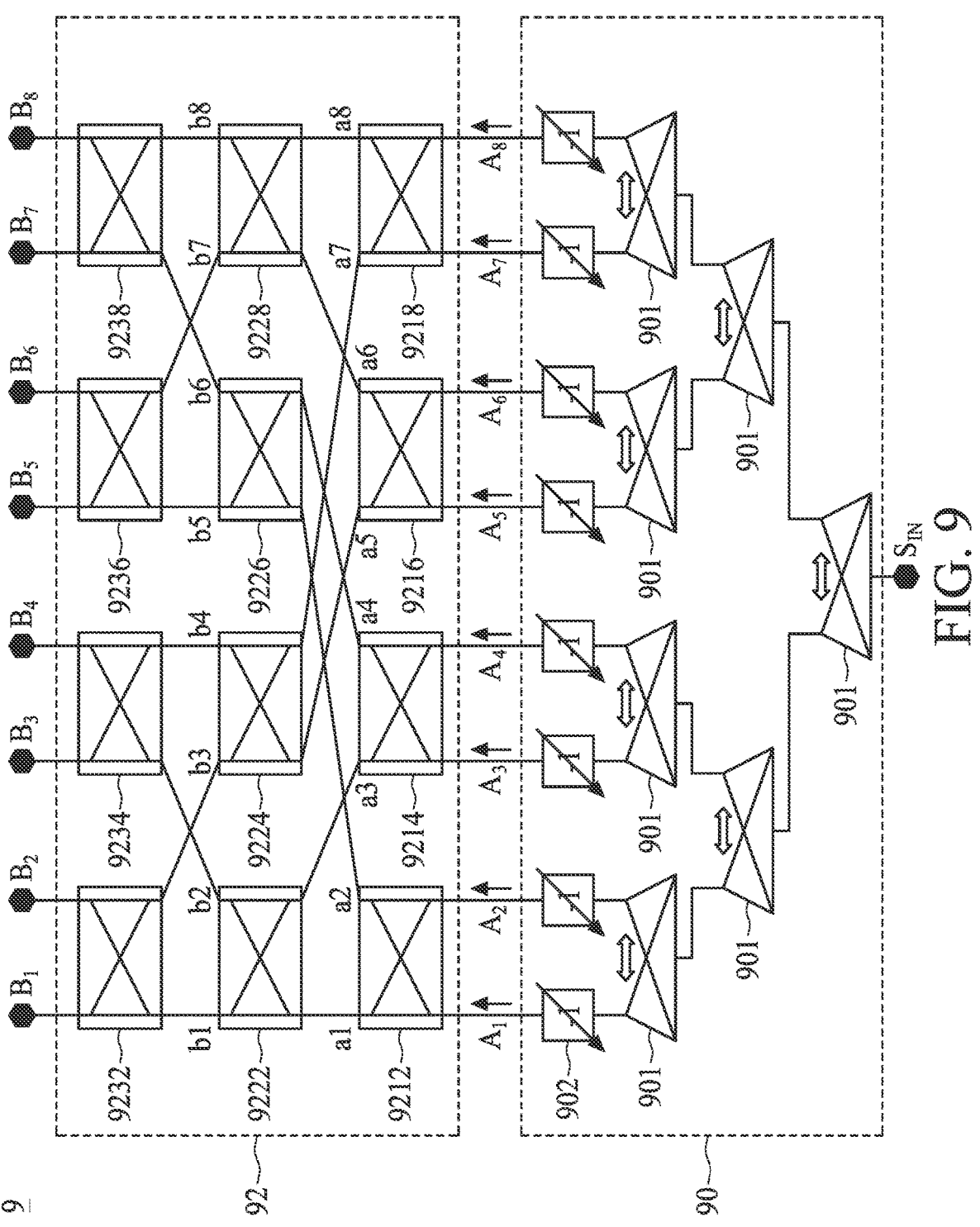
FIG. 9 is a block diagram of a coupler device in accordance with yet another embodiment of the present disclosure.

FIG. 9 is a block diagram of a coupler device 9 in accordance with an embodiment of the present disclosure.

In some embodiments, the coupler device 9 may include a weighting network 90 and a phase matrix network 92. The weighting network may include a plurality of tunable amplifiers 901 and a plurality of phase inverters 902. Each of the tunable amplifiers 901 may be a 1-to-2 tunable amplifier which is similar to the tunable amplifier 2021 shown in FIG. 2B, and it may have the functions of power conservation and signal amplification.

The output signal of each tunable amplifier 901 at the third stage may be fed to the phase inverters 902 to invert the phase to generate an intermediate signal (e.g., A1 to A8).

The phase matrix network 92 may be configured to convert the intermediate signals A1 to A8 to output signals B1 to B8. The phase matrix network 92 may include a plurality of couplers 9212~9218, 9222~9228, and 9232~9238 that are arranged in first, second, and third stages. Each of the couplers 9212~9218, 9222~9228, and 9232~9238 may be similar to the coupler 2022 shown in FIG. 2B. For brevity, the labels on the input ports and output ports of the couplers 9212~9218, 9222~9228, and 9232~9238 are omitted here.

For example, the first stage of the phase matrix network 92 may include couplers 9212, 9214, 9216, and 9218. The couplers 9212, 9214, 9216, and 9218 may respectively receive intermediate signals A1~A2, A3~A4, A5~A6, and A7~A8 at their input ports, and generates intermediate signals a1~a2, a3~a4, a5~a6, and a7~a8 at their output ports.

The second stage of the phase matrix network 92 may include couplers 9222, 9224, 9226, and 9228. The coupler 9222 may receive the intermediate signals a1 and a3 at its two input ports, and generate intermediate signals b1 and b2 at its two output ports. The coupler 9224 may receive the intermediate signals a5 and a7 at its two input ports, and generate intermediate signals b3 and b4 at its two output ports. The coupler 9226 may receive the intermediate signals a2 and a4 at its two input ports, and generate intermediate signals b5 and b6 at its two output ports. The coupler 9228 may receive the intermediate signals a6 and a8 at its two input ports, and generate intermediate signals b7 and b8 at its two output ports.

The third stage of the phase matrix network 92 may include couplers 9232, 9234, 9236, and 9238. The coupler 9232 may receive the intermediate signals b1 and b3 at its two input ports, and generate output signals B1 and B2 at its two output ports. The coupler 9234 may receive the intermediate signals b2 and b4 at its two input ports, and generate intermediate signals B3 and B4 at its two output ports. The coupler 9236 may receive the intermediate signals b5 and b7 at its two input ports, and generate intermediate signals B5 and B6 at its two output ports. The coupler 9238 may receive the intermediate signals b6 and b8 at its two input ports, and generate intermediate signals B6 and B8 at its two output ports.

Considering the perfect matching condition, each of the output signals B1~B8 may be a linear combination of the input signals A1~A8, and the coefficients of the linear combination may be transmission coefficients from input ports to output ports of the phase matrix network 92. Specifically, the phase matrix network 92 may be configured to perform a matrix multiplication operation of an input matrix {A1, A2, ..., A8} and a phase matrix M of the phase matrix network 92 to obtain an output matrix {B1, B2, ..., B8}. The matrix multiplication operation can be expressed by formula (7) as follows.

$$\begin{bmatrix} B_1 \\ B_2 \\ \vdots \\ B_8 \end{bmatrix} = M \begin{bmatrix} A_1 \\ A_2 \\ \vdots \\ A_8 \end{bmatrix} \tag{7}$$

If the target output signals are determined, the input signals of the input matrix can be evaluated by an inverse matrix multiplication operation, which can be expressed by formula (8) as follows.

$$\begin{bmatrix} A_1 \\ A_2 \\ \vdots \\ A_8 \end{bmatrix} = M^{-1} \begin{bmatrix} B_1 \\ B_2 \\ \vdots \\ B_8 \end{bmatrix} \tag{8}$$

where $M^{-1}$ denotes the inverse matrix of the phase matrix M. If the input signals to be evaluated are in-phase or out-phase to each other, the input matrix {A1, A2, ..., A8} can be expressed as $e^{-j\angle A_1}\{R_{A1}, R_{A2}, ..., R_{A8}\}$, wherein $R_{A1}$~$R_{A8}$ are real numbers. If both sides in formula (8) are multiplied by $e^{-j\angle A_1}$, formula (8) can be rewritten to formula (9) as follows.

$$e^{-j\angle A_1}\begin{bmatrix} B_1 \\ B_2 \\ \vdots \\ B_8 \end{bmatrix} = M \begin{bmatrix} RA_1 \\ RA_2 \\ \vdots \\ RA_8 \end{bmatrix} \tag{9}$$

Since $e^{-j\angle A_1}$ is a constant while evaluating the phase matrix M, the pattern related to the output signals of the array $e^{-j\angle A_1}$ {B1, B2, ..., B8} may be identical to that related to the output signals of the array {B1, B2, ..., B8}. Since all elements $R_{A1}$ to $R_{A8}$ in the array {$R_{A1}$, $R_{A2}$, ..., $R_{A8}$} are real numbers, they can be calculated by a dedicated circuit having power dividing, amplitude weighting, and sign switching. For example, the tunable amplifiers 901 may be configured to perform the power dividing and amplitude weighting functions. The phase inverters 902 may be configured to perform the sign switching function. It should be noted that the phase inverters 902 may be lossless phase inverters, and the amplitude of the sign-switched signal at the output terminal of each phase inverter 902 may be substantially the same with that of the input signal at the input terminal of each phase inverter 902.

In some embodiments, the phase matrix M of the phase matrix network 92 can be expressed by formula (10) as follows.

$$M = \qquad (10)$$

$$L_{PMN} \times e^{-j\alpha} \times \begin{bmatrix} e^{j0} & e^{-j\frac{\pi}{2}} & e^{-j\frac{\pi}{2}} & e^{-j\pi} & e^{-j\frac{\pi}{2}} & e^{-j\pi} & e^{-j\pi} & e^{j\frac{\pi}{2}} \\ e^{-j\frac{\pi}{2}} & e^{-j\pi} & e^{-j\pi} & e^{j\frac{\pi}{2}} & e^{j0} & e^{-j\frac{\pi}{2}} & e^{-j\frac{\pi}{2}} & e^{-j\pi} \\ e^{-j\frac{\pi}{2}} & e^{-j\pi} & e^{j0} & e^{-j\frac{\pi}{2}} & e^{-j\pi} & e^{j\frac{\pi}{2}} & e^{-j\frac{\pi}{2}} & e^{-j\pi} \\ e^{-j\pi} & e^{j\frac{\pi}{2}} & e^{-j\frac{\pi}{2}} & e^{-j\pi} & e^{-j\frac{\pi}{2}} & e^{-j\pi} & e^{j0} & e^{-j\frac{\pi}{2}} \\ e^{-j\frac{\pi}{2}} & e^{j0} & e^{-j\pi} & e^{-j\frac{\pi}{2}} & e^{-j\pi} & e^{-j\frac{\pi}{2}} & e^{j\frac{\pi}{2}} & e^{-j\pi} \\ e^{-j\pi} & e^{-j\frac{\pi}{2}} & e^{j\frac{\pi}{2}} & e^{-j\pi} & e^{-j\frac{\pi}{2}} & e^{j0} & e^{-j\pi} & e^{-j\frac{\pi}{2}} \\ e^{-j\pi} & e^{-j\frac{\pi}{2}} & e^{-j\frac{\pi}{2}} & e^{j0} & e^{j\frac{\pi}{2}} & e^{-j\pi} & e^{-j\pi} & e^{-j\frac{\pi}{2}} \\ e^{j\frac{\pi}{2}} & e^{-j\pi} & e^{-j\pi} & e^{-j\frac{\pi}{2}} & e^{-j\pi} & e^{-j\frac{\pi}{2}} & e^{-j\frac{\pi}{2}} & e^{j0} \end{bmatrix}$$

in which $L_{PMN}$ denotes the distribution and transmission loss; $e^{-j\alpha}$ denotes the phase delay of the shortest path of the phase matrix network 92.

Assuming that the output signals B1 to B8 are set up to synthesize a normal 8-element antenna beam pattern with the beam angle from −90° to 90°, the elements B1 to B8 can be expressed by formula (11) as follows.

$$\begin{bmatrix} B_1 \\ B_2 \\ B_3 \\ B_4 \\ B_5 \\ B_6 \\ B_7 \\ B_8 \end{bmatrix} = k \begin{bmatrix} e^{-j0\phi} \\ e^{-j1\phi} \\ e^{-j2\phi} \\ e^{-j3\phi} \\ e^{-j4\phi} \\ e^{-j5\phi} \\ e^{-j6\phi} \\ e^{-j7\phi} \end{bmatrix} \qquad (11)$$

In which k denotes the amplitude of the output signals B1 to B8. Assuming d is the antenna spacing and half wavelength $\lambda/2$, the angle $\phi$ can be calculated by the beam angle $\theta_d$ using formula (12) as follows.

$$\varphi = \frac{2\pi d \sin\theta_d}{\lambda} \qquad (12)$$

In some embodiments, the phase matrix M of the matrix multiplication operation performed by the phase matrix network 72 shown in FIG. 7B can be derived in a similar manner as described above.

Figure 10:
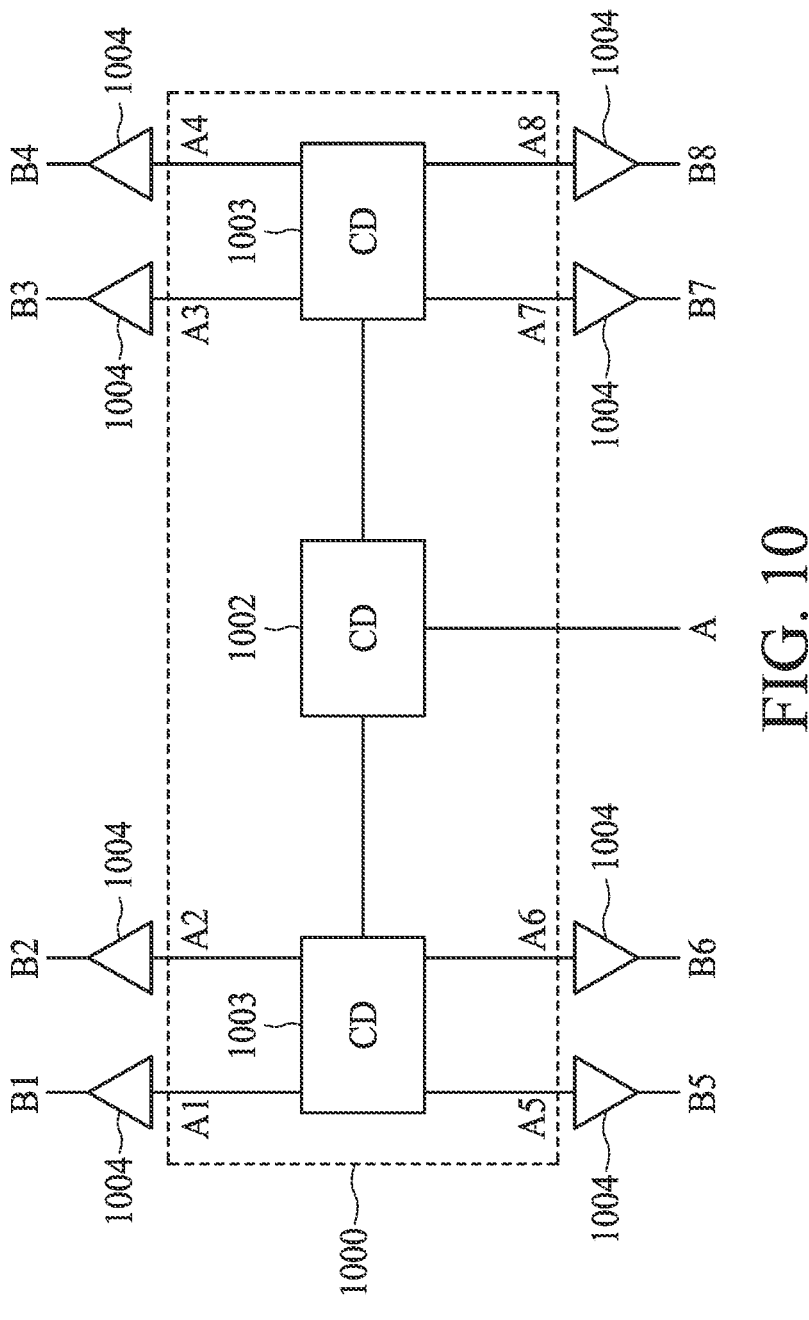
FIG. 10 is a block diagram of a phased array system in accordance with yet another embodiment of the present disclosure.

FIG. 10 is a block diagram of a phased array system in accordance with yet another embodiment of the present disclosure. Please refer to FIG. 2B, FIG. 4, FIG. 7B, and FIG. 10.

In some embodiments, the phased array system 10a may include a weighting network 1000 and a plurality of amplifiers 1004. The weighting network 1000 may include a coupler device 1002 and a plurality of coupler devices 1003.

The coupler device 1002 may be a 1-to-2 coupler device that can be implemented using the coupler device 202 shown in FIG. 2B or the coupler device 400 shown in FIG. 4. The coupler device 1003 may be a 1-to-4 coupler device that can be implemented using the coupler device 702 shown in FIG. 7B.

More specifically, the phased array system 10a may be designed for 8 antennae, and it may generate 8 output signals B1 to B8. If the coupler device 202 shown in FIG. 2B or the coupler device 400 shown in FIG. 4 are used in the weighting network 1000, these coupler devices may be arranged in a 3-stage cascaded architecture to establish 8 paths. With the assist of the coupler device 702 shown in FIG. 7B, the weighting network 1000 can be rearranged to a 2-stage cascaded architecture, wherein the first stage includes a 1-to-2 coupler device (e.g., the coupler device 202 shown in FIG. 2B or the coupler device 400 shown in FIG. 4), and the second stage includes 1-to-4 coupler device (e.g., the coupler device 702 shown in FIG. 7B).

In some embodiments, one 1-to-4 coupler device may be used as 2 stages of 1-to-2 coupler devices. Similarly, one 1-to-8 coupler device (e.g., coupler device 9 in FIG. 9) may be used as 3 stages of 1-to-2 coupler devices or used as 1 stage of a 1-to-2 coupler device plus 1 stage of a 1-to-4 coupler device. In addition, the 1-to-2 coupler device, 1-to-4 coupler device, 1-to-8 coupler device, and combinations thereof can be used to generate the number of output signals for a phased array system.

The scope of the present disclosure is not intended to be limited to the particular embodiments of the process, machine, manufacture, and composition of matter, means, methods, steps, and operations described in the specification. As those skilled in the art will readily appreciate from the disclosure of the present disclosure, processes, machines, manufacture, composition of matter, means, methods, steps, or operations presently existing or later to be developed that perform substantially the same function or achieve substantially the same result as the corresponding embodiments described herein may be utilized according to the present disclosure. Accordingly, the appended claims are intended to include within their scope processes, machines, manufacture, and compositions of matter, means, methods, steps, or operations. In addition, each claim constitutes a separate embodiment, and the combination of various claims and embodiments are within the scope of the disclosure.

The methods, processes, or operations according to embodiments of the present disclosure can also be implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of the present disclosure.

An alternative embodiment preferably implements the methods, processes, or operations according to embodiments of the present disclosure on a non-transitory, computer-readable storage medium storing computer programmable instructions. The instructions are preferably executed by computer-executable components preferably integrated with a network security system. The non-transitory, computer-readable storage medium may be stored on any suitable computer readable media such as RAMs, ROMs, flash memory, EEPROMs, optical storage devices (CD or DVD), hard drives, floppy drives, or any suitable device. The computer-executable component is preferably a processor, but the instructions may alternatively or additionally be executed by any suitable dedicated hardware device. For example, an embodiment of the present disclosure provides a non-transitory, computer-readable storage medium having computer programmable instructions stored therein.

While the present disclosure has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be able to make and use the teachings of the present disclosure by simply employing the elements of the independent claims. Accordingly, embodiments of the present disclosure as set forth herein are intended to be illustrative, not limiting. Various changes may be made without departing from the spirit and scope of the present disclosure.

Even though numerous characteristics and advantages of the present disclosure have been set forth in the foregoing description, together with details of the structure and function of the invention, the disclosure is illustrative only. Changes may be made to details, especially in matters of shape, size, and arrangement of parts, within the principles of the invention to the full extent indicated by the broad general meaning of the terms in which the appended claims are expressed.

What is claimed is:

1. A coupler device, for use in a phased array system, the coupler device comprising:
   a weighting network, comprising: a plurality of tunable amplifiers arranged in two stages, wherein the plurality of tunable amplifiers are configured to convert an input signal to a first amplified signal, a second amplified signal, a third amplified signal, and a fourth amplified signal; and
   a phase matrix network, coupled to the weighting network, wherein the phase matrix network is configured to generate a first output signal, a second output signal, a third output signal, and a fourth output signal based on the first amplified signal, the second amplified signal, the third amplified signal, and the fourth amplified signal.

2. The coupler device of claim 1, wherein each of the tunable amplifiers is a 1-to-2 tunable amplifier configured to convert a first signal to a second signal and a third signal, and a first difference between a first phase of the second signal and a second phase of the third signal is a fixed phase angle.

3. The coupler device of claim 2, wherein each of the tunable amplifiers is further configured to adjust a first gain of the second signal and a second gain of the third signal so as to adjust the fixed phase angle.

4. The coupler device of claim 1, wherein each of the tunable amplifiers comprises:
   a first bipolar junction transistor, having a base controlled by a first control voltage, a collector, connected to an input port of a first output matching network, and an emitter being grounded; and
   a second bipolar junction transistor, having a base controlled by a second control voltage, a collector, connected to an input port of a second output matching network, and an emitter being grounded;
   wherein the first bipolar junction transistor and the second bipolar junction transistor are shunted.

5. The coupler device of claim 4, wherein each of the tunable amplifiers further comprises an input matching network configured to match an impedance of the first bipolar junction transistor and the second bipolar junction transistor to a system impedance.

6. The coupler device of claim 4, wherein the first output matching network and the second output matching network are substantially the same, and the first output matching network is configured to match a first output impedance of the first bipolar junction transistor to a system impedance, and the second output matching network is configured to match a second output impedance of the second bipolar junction transistor to the system impedance.

7. The coupler device of claim 1, wherein each of the tunable amplifiers has functions of power conservation and signal amplification.

8. The coupler device of claim 1, wherein the phase matrix network comprises a first stage and a second stage,
   wherein the first stage comprises a first coupler and a second coupler, and the first coupler generates a first intermediate signal and a second intermediate signal based on the first amplified signal and the second amplified signal, and the second coupler generates a third intermediate signal and a fourth intermediate signal based on the third amplified signal and the fourth amplified signal.

9. The coupler device of claim 8, wherein the second stage comprises a third coupler and a fourth coupler, and the third coupler generates the first output signal and the second output signal based on the first intermediate signal and the third intermediate signal, and the fourth coupler generates the third output signal and the fourth output signal based on the second intermediate signal and the fourth intermediate signal.

10. The coupler device of claim 9, wherein the first coupler, the second coupler, the third coupler, and the fourth coupler are 90-degree hybrid couplers.

11. A coupler device, for use in a phased array system, the coupler device comprising:
   a weighting network, configured to convert and amplify an input signal to obtain eight intermediate amplified signals; and
   a phase matrix network, coupled to the weighting network, wherein the phase matrix network is configured to generate eight output signals based on the eight intermediate amplified signals,
   wherein an output array of the eight output signals is obtained by performing a matrix multiplication of an array of the eight intermediate amplified signals with a phase matrix of the phase matrix network,
   wherein the weighting network comprises a plurality of tunable amplifiers arranged in a first stage, a second stage, and a third stage arranged in a cascaded architecture, and each of the tunable amplifiers is a 1-to-2 tunable amplifier configured to convert a first signal to a second signal and a third signal, and a first difference between a first phase of the second signal and a second phase of the third signal is a fixed phase angle.

12. The coupler device of claim 11, wherein the first stage comprises a first tunable amplifier configured to convert and amplify the input signal to obtain a first signal and a second signal, wherein the second stage comprises a second tunable amplifier and a third tunable amplifier, and the second tunable amplifier is configured to convert and amplify the first signal to obtain a fourth signal and a fifth signal, and the third tunable amplifier is configured to convert and amplify the second signal to obtain a sixth signal and a seventh signal.

13. The coupler device of claim 12, wherein the third stage comprises a fourth tunable amplifier, a fifth tunable amplifier, a sixth tunable amplifier, and a seventh tunable amplifier, wherein the fourth tunable amplifier is configured to convert and amplify the fourth signal to obtain a first amplified signal and a second amplified signal, and the fifth tunable amplifier is configured to convert and amplify the fifth signal to obtain a third amplified signal and a fourth amplified signal, wherein the sixth tunable amplifier is configured to convert and amplify the sixth signal to obtain a fifth amplified signal and a sixth amplified signal, and the seventh tunable amplifier is configured to convert and amplify the seventh signal to obtain a seventh amplified signal and an eighth amplified signal.

14. The coupler device of claim 13, wherein the weighting network further comprises a plurality of phase inverters configured to invert phases of the first amplified signal, the second amplified signal, the third amplified signal, the fourth amplified signal, the fifth amplified signal, the sixth amplified signal, the seventh amplified signal, and the eighth amplified signal to obtain a first intermediate amplified signal, a second intermediate amplified signal, a third intermediate amplified signal, a fourth intermediate amplified signal, a fifth intermediate amplified signal, a sixth intermediate amplified signal, a seventh intermediate amplified signal, and an eighth intermediate amplified signal.

15. The coupler device of claim 14, wherein the phase matrix network comprises a first coupler stage, a second coupler stage, and a third coupler stage, wherein the first coupler stage comprises a first coupler, a second coupler, a third coupler, and a fourth coupler, and the first coupler generates a first intermediate signal and a second intermediate signal based on the first intermediate amplified signal and the second intermediate amplified signal, and the second coupler generates a third intermediate signal and a fourth intermediate signal based on the third intermediate amplified signal and the fourth intermediate amplified signal, wherein the third coupler generates a fifth intermediate signal and a sixth intermediate signal based on the fifth intermediate amplified signal and the sixth intermediate amplified signal, and the fourth coupler generates a seventh intermediate signal and an eighth intermediate signal based on the seventh intermediate amplified signal and the eighth intermediate amplified signal.

16. The coupler device of claim 15, wherein the second coupler stage comprises a fifth coupler, a sixth coupler, a seventh coupler, and an eighth coupler, and the fifth coupler generates a ninth intermediate signal and a tenth intermediate signal based on the first intermediate signal and the second intermediate signal, and the sixth coupler generates a eleventh intermediate signal and a twelfth intermediate signal based on the fifth intermediate signal and the seventh intermediate signal, wherein the seventh coupler generates a thirteenth intermediate signal and a fourteenth intermediate signal based on the second intermediate signal and the fourth intermediate signal, and the eighth coupler generates a fifteenth intermediate signal and a sixteenth intermediate signal based on the sixth intermediate signal and the eighth intermediate signal.

17. The coupler device of claim 16, wherein the third coupler stage comprises a ninth coupler, a tenth coupler, an eleventh coupler, and a twelfth coupler, and the ninth coupler generates a first output signal and a second output signal based on the ninth intermediate signal and the eleventh intermediate signal, and the tenth coupler generates a third output signal and a fourth output signal based on the tenth intermediate signal and the twelfth intermediate signal, wherein the eleventh coupler generates a fifth output signal and a sixth output signal based on the thirteenth intermediate signal and the fifteenth intermediate signal, and the twelfth coupler generates a seventh output signal and an eighth output signal based on the fourteenth intermediate signal and the sixteenth intermediate signal.

18. The coupler device of claim 11, wherein each of the tunable amplifiers is further configured to adjust a first gain of the second signal and a second gain of the third signal so as to adjust the fixed phase angle.

19. The coupler device of claim 11, wherein each of the tunable amplifiers has functions of power conservation and signal amplification.

* * * * *